: US 12,170,112 B2
(45) Date of Patent: Dec. 17, 2024

(54) STORAGE DEVICE FOR DETERMINING MEMORY CELL TYPE AFTER DATA INPUT DURING PROGRAM OPERATION AND OPERATING METHOD THEREOF

(71) Applicant: SK hynix Inc., Icheon-si (KR)

(72) Inventors: Ie Ryung Park, Icheon-si (KR); Dong Sop Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 18/346,171

(22) Filed: Jun. 30, 2023

(65) Prior Publication Data

US 2024/0274201 A1 Aug. 15, 2024

(30) Foreign Application Priority Data

Feb. 13, 2023 (KR) ........................ 10-2023-0018428

(51) Int. Cl.
*G06F 3/06* (2006.01)
*G11C 16/10* (2006.01)
*G11C 16/30* (2006.01)

(52) U.S. Cl.
CPC .............. *G11C 16/10* (2013.01); *G06F 3/061* (2013.01); *G06F 3/0658* (2013.01); *G06F 3/0659* (2013.01); *G06F 3/0673* (2013.01); *G11C 16/30* (2013.01)

(58) Field of Classification Search
CPC ....... G11C 16/10; G06F 3/061; G06F 3/0658; G06F 3/0659; G06F 3/0673; G06F 16/30
See application file for complete search history.

(56) References Cited

U.S. PATENT DOCUMENTS

| 2007/0211746 | A1* | 9/2007 | Oshikiri | G06F 13/4022 |
| | | | | 370/437 |
| 2008/0080291 | A1* | 4/2008 | Ha | G11C 7/22 |
| | | | | 365/230.06 |
| 2013/0322155 | A1* | 12/2013 | Ahn | G11C 13/0061 |
| | | | | 365/148 |
| 2014/0022842 | A1 | 1/2014 | Jung et al. | |
| 2019/0122736 | A1* | 4/2019 | Chun | G06F 11/1068 |
| 2021/0056023 | A1* | 2/2021 | Jin | G06F 3/0679 |
| 2021/0181987 | A1 | 6/2021 | Um | |
| 2021/0182152 | A1* | 6/2021 | Shin | G11C 16/08 |
| 2022/0246181 | A1 | 8/2022 | Lin | |

* cited by examiner

*Primary Examiner* — Christopher D Birkhimer

(57) ABSTRACT

A storage device may input a program command requesting to program target data into the memory, input the target data into a memory, and input the program confirmation command into the memory after inputting the program command and the target data into the memory. In this case, the program confirmation command may include information about a cell type of memory cells to be programmed with target data among a plurality of memory cells.

12 Claims, 8 Drawing Sheets

STORAGE DEVICE FOR DETERMINING MEMORY CELL TYPE AFTER DATA INPUT DURING PROGRAM OPERATION AND OPERATING METHOD THEREOF

CROSS-REFERENCE TO RELATED APPLICATION

The present application claims priority under 35 U.S.C. § 119(a) to Korean patent application number 10-2023-0018428 filed in the Korean Intellectual Property Office on Feb. 13, 2023, which is incorporated herein by reference in its entirety.

TECHNICAL FIELD

Embodiments of the present disclosure relate to a storage device for determining a memory cell type after data input during a program operation and an operating method thereof.

BACKGROUND

A storage device is a device for storing data based on a request from an external device such as a computer, a mobile terminal such as a smart phone or tablet, or various electronic devices.

The storage device may further include a controller for controlling memory (e.g. volatile memory/non-volatile memory). The controller may receive a command from an external device, and execute or control operations to read, write, or erase data in the memory included in the storage device based on an input command When a storage device writes data into a memory, the cell type of memory cells storing the data must be determined. Accordingly, a controller may transmit information about the cell type of memory cells storing data to the memory.

SUMMARY

Embodiments of the disclosure may provide a storage device and an operating method thereof capable of efficiently programming data into memory when a power-down event occurs after the data has been written to memory.

In one aspect, embodiments of the disclosure may provide a storage device including i) a memory including a plurality of memory cells, and ii) a controller configured to input a program command requesting to program target data to all or a part of the plurality of memory cells into the memory, input the target data to the memory, and input, after inputting the program command and the target data to the memory, a program confirmation command including cell type information of memory cells to be programmed, from among the plurality of memory cells, with the target data among the plurality of memory cells and instructing the start of an operation of programming the target data into the memory.

In another aspect, embodiments of the disclosure may provide an operating method of a storage device including i) inputting a program command requesting to program target data to all or a part of a plurality of memory cells into a memory including the plurality of memory cells, ii) inputting the target data to the memory, and iii) inputting, after inputting the program command and the target data to the memory, a program confirmation command including cell type information of memory cells to be programmed, from among the plurality of memory cells, with the target data and instructing start of an operation of programming the target data into the memory.

According to embodiments of the present disclosure, it is possible to program data into the memory more efficiently if a power-down event occurs after inputting data into the memory.

DETAILED DESCRIPTION

Figure 1:
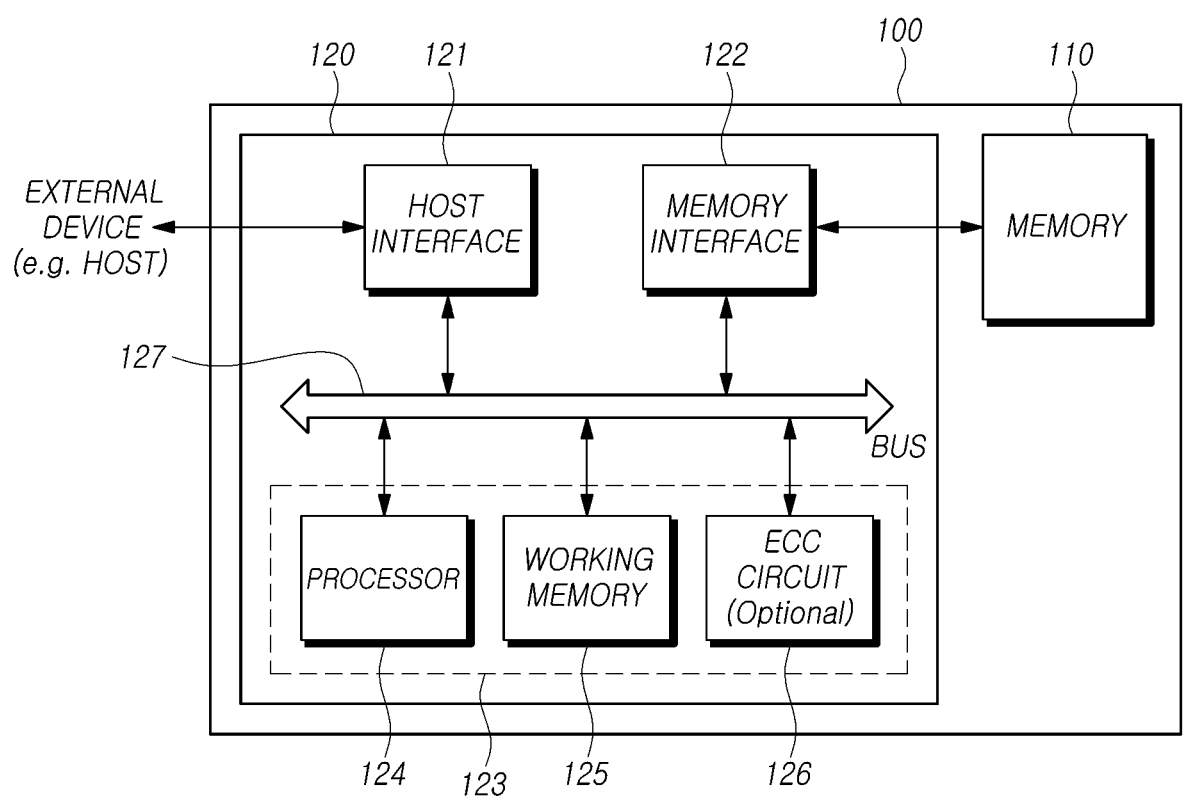
FIG. 1 is a schematic configuration diagram of a storage device according to an embodiment of the disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily limited to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic configuration diagram of a storage device according to an embodiment of the disclosure.

Referring to FIG. 1, a storage device 100 may include a memory 110 that stores data and a controller 120 that controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") that store data. Such a memory cell array may exist in a memory block.

For example, the memory 110 may be realized in various types of memory such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (STT-RAM).

The memory 110 may be implemented as a three-dimensional array structure. For example, embodiments of the disclosure may be applied to a charge trap flash (CTF) in which a charge storage layer is configured by a dielectric layer and a flash memory in which a charge storage layer is configured by a conductive floating gate.

The memory 110 may receive a command and an address from the controller 120 and may access an area in the memory cell array that is selected by the address. In other words, the memory 110 may perform an operation indicated by the command, on the area selected by the address.

The memory 110 may perform a program operation, a read operation or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, also may control the operation of the memory 110 regardless or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, and a mobility device (e.g., a vehicle, a robot or a drone) capable of driving under human control or autonomous driving, as non-limiting examples. Alternatively, the host may be a virtual reality (VR) device providing 2D or 3D virtual reality images or an augmented reality (AR) device providing augmented reality images. The host may be any one of various electronic devices that require the storage device 100, which is capable of storing data.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other, or the controller 120 and the host may be integrated into one device. Hereunder, for the sake of convenience in explanation, descriptions will describe the controller 120 and the host as devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. Hereafter, an operation of the storage device 100 according to embodiments of the disclosure will be described as implementing a processor 124 that executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer (FTL), which performs a translating function between a logical address requested to the storage device 100 from the host and a physical address of the memory 110; a host interface layer (HIL), which serves to analyze a command requested to the storage device 100 as a storage device from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware, in which a logic calculation to be performed is defined, is stored in the memory 110, but not loaded in the working memory 125, the processor 124 may generate an event (e.g., an interrupt) for loading the corresponding part of the firmware into the working memory 125 from the memory 110.

The processor 124 may load metadata necessary for driving firmware from the memory 110. The metadata, as data for managing the memory 110, may include for example management information on user data stored in the memory 110.

Firmware may be updated while the storage device 100 is manufactured or while the storage device 100 is operating. The controller 120 may download new firmware from the outside of the storage device 100 and update existing firmware with the new firmware.

To drive the controller 120, the working memory 125 may store necessary firmware, a program code, a command and data. The working memory 125 may be a volatile memory that includes, for example, at least one from among an SRAM (static RAM), a DRAM (dynamic RAM) and an SDRAM (synchronous DRAM).

The error detection and correction circuit 126 may detect an error bit of target data, and correct the detected error bit by using an error correction code. The target data may be, for example, data stored in the working memory 125 or data read from the memory 110.

The error detection and correction circuit 126 may decode data by using an error correction code. The error detection and correction circuit 126 may be realized by various code decoders. For example, a decoder that performs unsystematic code decoding or a decoder that performs systematic code decoding may be used.

For example, the error detection and correction circuit 126 may detect an error bit by the unit of a set sector in each of the read data, when each read data is constituted by a plurality of sectors. A sector may mean a data unit that is smaller than a page, which is the read unit of a flash memory. Sectors constituting each read data may be matched with one another using an address.

The error detection and correction circuit 126 may calculate a bit error rate (BER), and may determine whether an error is correctable or not, by sector units. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, then the error detection and correction circuit 126 may detect a sector that is uncorrectable in read data last. There may be one or more sectors that are determined to be uncorrectable. The error detection and correction circuit 126 may transfer information (e.g., address information) regarding a sector that is determined to be uncorrectable to the processor 124.

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. In addition to the above-described components 121, 122, 124, 125 and 126 of the controller 120, one or more other components may be added.

Hereinbelow, the memory 110 will be described in further detail with reference to FIG. 2.

Figure 2:
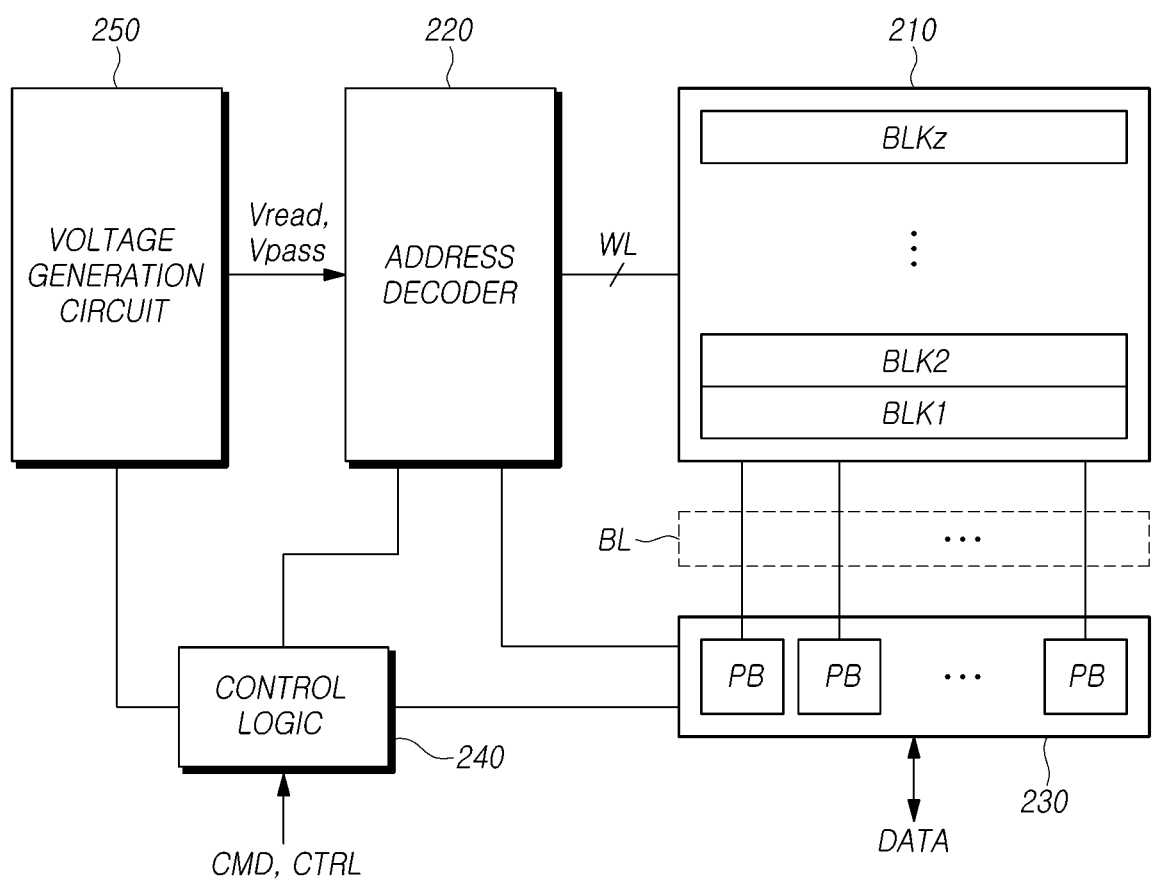
FIG. 2 is a block diagram schematically illustrating a memory of FIG. 1.

FIG. 2 is a block diagram schematically illustrating a memory of FIG. 1.

Referring to FIG. 2, a memory 110 may include a memory cell array 210, an address decoder 220, a read and write circuit 230, a control logic 240, and a voltage generation circuit 250.

The memory cell array 210 may include a plurality of memory blocks BLK1 to BLKz (where z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells included in the memory cell array 210 may store at least 1-bit data. For instance, each of the plurality of memory cells included in the memory cell array 210 may be a single level cell (SLC) that stores 1-bit data. In another instance, each of the plurality of memory cells included in the memory cell array 210 may be a multi-level cell (MLC) that stores 2-bit data. In still another instance, each of the plurality of memory cells included in the memory cell array 210 may be a triple level cell (TLC) that stores 3-bit data. In yet another instance, each of the plurality of memory cells included in the memory cell array 210 may be a quad level cell (QLC) that stores 4-bit data. In a further instance, the memory cell array 210 may include a plurality of memory cells, each of which stores 5 or more-bit data.

The number of bits of data stored in each of the plurality of memory cells may be dynamically determined. For example, a single-level cell that stores 1-bit data may be changed to a triple-level cell that stores 3-bit data.

Referring to FIG. 2, the address decoder 220, the read and write circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address and a column address.

The address decoder 220 may select one memory block and one word line depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes a plurality of page buffers PB. The read and write circuit 230 may include data buffers that take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, changes in the amounts of current flowing, depending on the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. In another example, each of the plurality of word lines WL may be disposed in a column direction, and each of the plurality of bit lines BL may be disposed in a row direction.

A memory cell may be coupled to one of the plurality of word lines WL and one of the plurality of bit lines BL. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
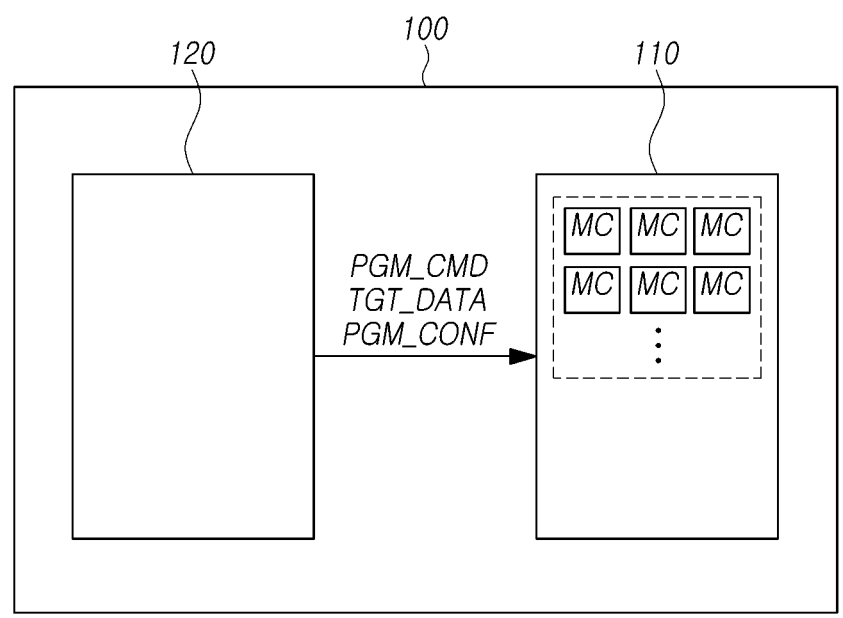
FIG. 3 illustrates a schematic operation of a storage device according to an embodiment of the present disclosure.

FIG. 3 illustrates a schematic operation of a storage device 100 according to an embodiment of the present disclosure.

Referring to FIG. 3, a storage device 100 may include a memory 110 and a controller 120.

The memory 110 may include a plurality of memory cells MC. A plurality of memory cells MC may be included in memory cell array 210 as described above. The plurality of memory cells MC may have various cell types (e.g., SLC, MLC, TLC, QLC), and the cell type of each of the plurality of memory cells MC may be dynamically changed.

The controller 120 may input a program command PGM_CMD, a target data TGT_DATA, and a program confirmation command PGM_CONF to the memory 110 in order to program the target data TGT_DATA to all or a part of the plurality of memory cells MC.

The program command PGM_CMD may be a command requesting to program target data TGT_DATA into all or some of the plurality of memory cells MC.

The program confirmation command PGM_CONF may be a command instructing the start of an operation of programming the target data TGT_DATA in the memory 110. After receiving the program confirmation command PGM_CONF, the memory 110 may execute an operation of programming the target data TGT_DATA into all or some of the plurality of memory cells MC.

Hereinafter, in FIGS. 4 and 5, embodiments will be described in which a controller 120 of the storage device 100 executes an operation of inputting a program command PGM_CMD, target data TGT_DATA, and a program confirmation command PGM_CONF into the memory 110 to program the target data TGT_DATA.

Figure 4:
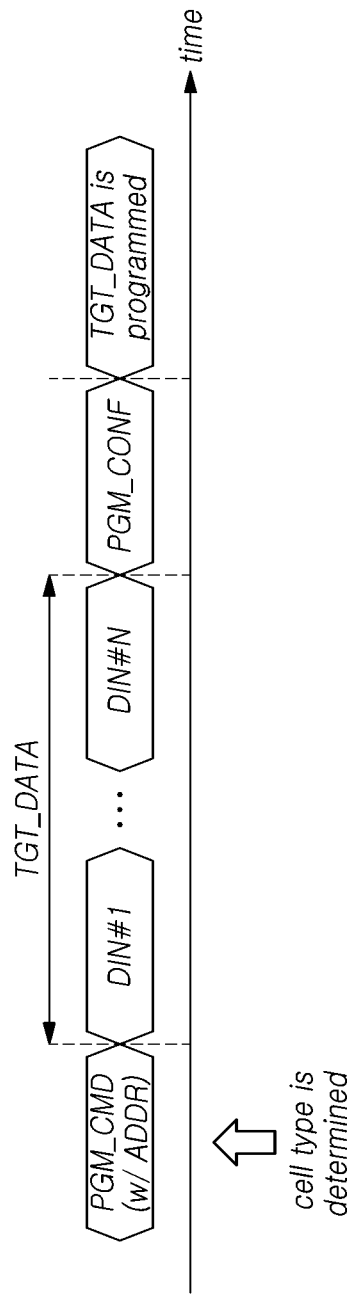
FIG. 4 is a timing diagram illustrating an example of an operation of programming target data by a storage device according to an embodiment of the present disclosure.

FIG. 4 is a timing diagram illustrating an example of an operation of programming target data by a storage device according to an embodiment of the present disclosure.

Referring to FIG. 4, a controller 120 of a storage device 100 may input a program command PGM_CMD into a memory 110.

The controller 120 may input the address information ADDR into the memory 110 together with the program command PGM_CMD. The address information ADDR may be information indicating locations of the memory cells, from among a plurality of memory cells MC, to be programmed with target data TGT_DATA.

The controller 120 may indicate information about cell types of memory cells to be programmed with target data TGT_DATA by using the program command PGM_CMD.

The memory 110 may set the cell type of the plurality of memory cells MC according to information about the cell type of the plurality of memory cells MC indicated by the program command PGM_CMD.

The controller 120 may input the target data TGT_DATA into the memory 110 after inputting the program command PGM_CMD to the memory 110. For example, the controller 120 may input the data into the memory 110 by dividing the target data TGT_DATA into N data units DIN #1, ~, DIN #N (where N is a natural number).

The controller 120 may input the program confirmation command PGM_CONF into the memory 110 after inputting the target data TGT_DATA into the memory 110. As described above, after receiving the program confirmation command PGM_CONF, the memory 110 may execute an operation of programming the target data TGT_DATA into the plurality of memory cells MC.

Figure 5:
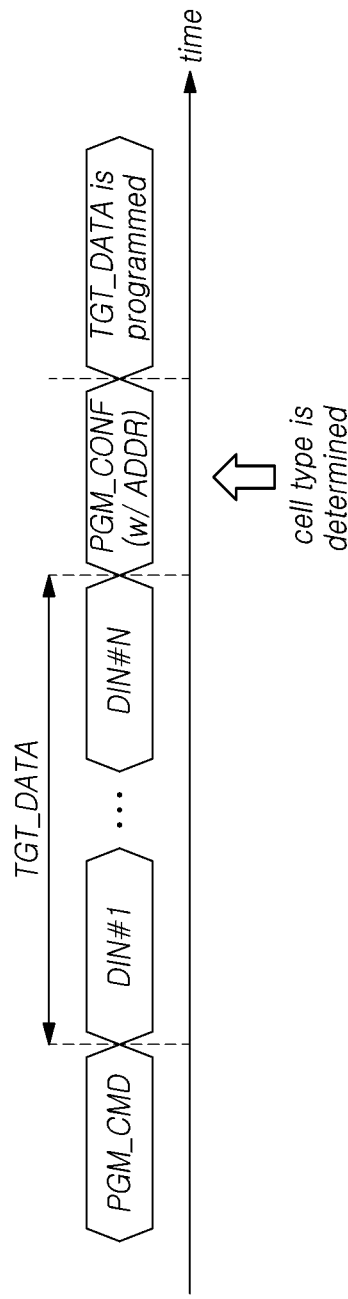
FIG. 5 is a timing diagram illustrating another example of an operation of programming target data by a storage device according to an embodiment of the present disclosure.

FIG. 5 is a timing diagram illustrating another example of an operation of programming target data by a storage device according to an embodiment of the present disclosure.

Referring to FIG. 5, a controller 120 of a storage device 100 may input a program command PGM_CMD to a memory 110. However, unlike FIG. 4, the program command PGM_CMD does not include information about cell types of the memory cells, from among the plurality of memory cells MC, to which target data TGT_DATA is to be programmed.

The controller 120 may input the target data TGT_DATA to the memory 110 after inputting the program command PGM_CMD to the memory 110. As in FIG. 4, the controller 120 may divide the target data TGT_DATA into N data units DIN #1, ~, DIN #N (where N is a natural number), and input the N data units into the memory 110.

The controller 120 may input a program confirmation command PGM_CONF into the memory 110 after inputting the target data TGT_DATA into the memory 110. As described above, after receiving the program confirmation command PGM_CONF, the memory 110 may program the target data TGT_DATA into all or some of the plurality of memory cells MC.

The controller 120 may indicate information about cell types of the memory cells, from among a plurality of memory cells MC, to be programmed with target data TGT_DATA by using the program confirmation command PGM_CONF. That is, the timing at which the controller 120 provides information about cell types of memory cells to be programmed with target data TGT_DATA is different from the timing illustrated in FIG. 4.

The memory 110 may set a cell type of memory cells to be programmed with target data TGT_DATA, from among a plurality of memory cells MC, based on cell type information indicated by the program confirmation command PGM_CONF.

The controller 120 may input the above-described address information ADDR into the memory 110 after inputting the target data TGT_DATA into the memory 110. For example, the address information ADDR may be input to the memory 110 together with the program confirmation command PGM_CONF.

The memory 110 may relocate the input target data TGT_DATA according to the cell type of memory cells to be programmed with the target data TGT_DATA. For example, if the cell type of memory cells to be programmed with the target data TGT_DATA is changed, then the memory 110 may relocate the input target data TGT_DATA to a new buffer. In another example, if the cell type of memory cells to be programmed with the target data TGT_DATA is changed, then the memory 110 may rewrite the target data TGT_DATA in a buffer previously storing the target data TGT_DATA.

In addition, the memory 110 may determine the number of bits stored in each memory cell and the number of program states according to the cell type of memory cells to be programmed with the target data TGT_DATA. For example, a memory cell of an SLC type may store 1-bit information and may have two program states, and a memory cell of an MLC type may store 2-bit information and may have four program states. A memory cell of a TLC type may store 3-bit information and may have eight program states, and a memory cell of a QLC type may store 4-bit information and may have sixteen program states. As the number of possible program states decreases, the number of memory cells having overlapping threshold voltages decreases, and as a result, the number of bits in which errors occur may decrease.

In an operation as described above and with reference to timing diagrams, the controller 120 of the storage device 100 inputs the program command PGM_CMD, the target data TGT_DATA and the program confirmation command PGM_CONF into the memory 110 in order to program the target data TGT_DATA.

Hereinafter, embodiments will be described in which an operation is executed when a power-down event occurs while the controller 120 of the storage device 100 is programming the target data TGT_DATA.

For example, a power-down event may occur if power supplied to the storage device 100 is unstable or if power supplied to the storage device 100 is suddenly cut off.

Figure 6:
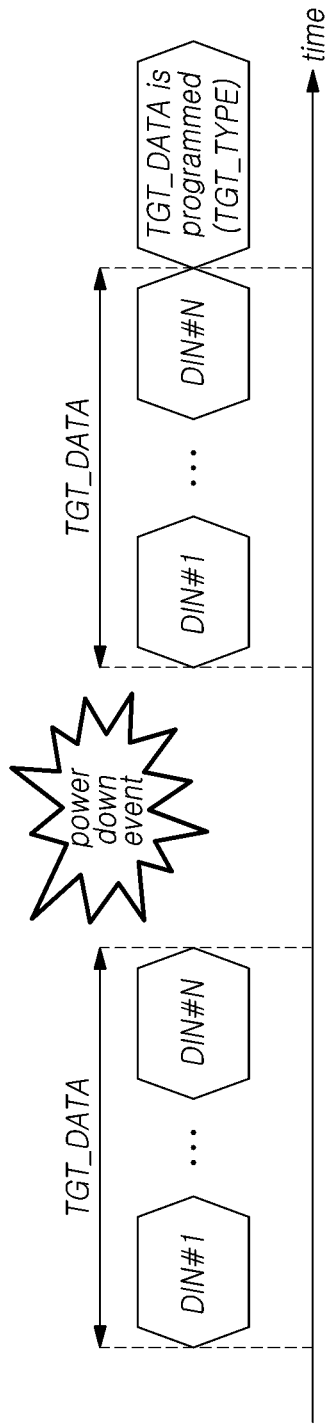
FIG. 6 is a timing diagram illustrating an example of an operation executed when a power-down event occurs while a storage device is programming target data according to an embodiment of the present disclosure.

FIG. 6 is a timing diagram illustrating an example of an operation executed when a power-down event occurs while a storage device is programming target data according to an embodiment of the present disclosure.

Referring to FIG. 6, a controller 120 of a storage device 100 is executing an operation of programming target data TGT_DATA into a memory 110 according to an embodiment described with reference to FIG. 4.

A power-down event may occur after the controller 120 inputs the target data TGT_DATA into the memory 110. In this case, the controller 120 is required to complete an operation of programming the target data TGT_DATA into the memory 110 even if a power-down event occurs.

Accordingly, the controller 120 may program the target data TGT_DATA into the memory 110 using power supplied from, for example, an auxiliary power supply (not shown).

An auxiliary power supply may be a device capable of supplying power to the storage device 100 if a power-down event occurs. For example, the auxiliary power supply may include a capacitor that is charged when power is supplied from the outside of the storage device 100 and that discharges to supply power to the storage device 100 when a power-down event occurs. The capacitor may be selected from a group consisting of, for example, a ceramic capacitor, a multilayer ceramic capacitor, a high dielectric constant capacitor, an electrolytic capacitor, and a tantalum polymer capacitor.

While power is being supplied from an auxiliary power supply (not shown), the memory 110 may set the cell type of the memory cells to be programmed with the target data TGT_DATA, from among the plurality of memory cells MC, as a target type TGT_TYPE.

The target type TGT_TYPE may be, for example, an SLC type. This is because the amount of time during which power can be supplied by an auxiliary power supply (not shown) is limited, and thus the target data TGT_DATA is required to be programmed as quickly as possible.

After a power-down event occurs, the controller 120 may input the target data TGT_DATA into the memory 110 again. This is because the target data TGT_DATA input to the memory 110 before the power-down event occurs is input while the cell type of the memory cells to be programmed with the target data TGT_DATA may be set to a different cell type instead of the target type TGT_TYPE.

Figure 7:
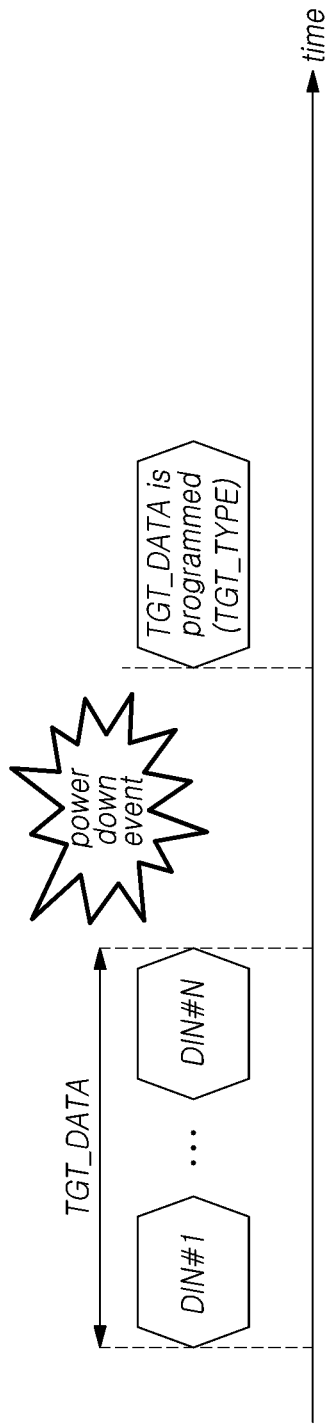
FIG. 7 is a timing diagram illustrating another example of an operation executed when a power-down event occurs while a storage device is programming target data according to an embodiment of the present disclosure.

FIG. 7 is a timing diagram illustrating another example of an operation executed when a power-down event occurs while a storage device is programming target data according to an embodiment of the present disclosure.

Referring to FIG. 7, a controller 120 of a storage device 100 is executing an operation of programming target data TGT_DATA into a memory 110 according to an embodiment described in FIG. 5.

In FIG. 7, a power-down event may occur after the controller 120 inputs the target data TGT_DATA into the memory 110.

The controller 120 is required to complete an operation of programming the target data TGT_DATA into the memory 110 even if a power-down event occurs. Accordingly, as in FIG. 6, there may be executed an operation of receiving power from an auxiliary power supply (not shown) and programming the target data TGT_DATA into the memory 110.

Similar to FIG. 6, the memory 110 may set the cell type of memory cells to be programmed with the target data TGT_DATA as a target type TGT_TYPE. As in FIG. 6, the target type TGT_TYPE may be an SLC type, for example.

Unlike FIG. 6, however, the controller 120 does not need to input the target data TGT_DATA to the memory 110 after the power down event because in FIG. 7, the cell type of memory cells to be programmed with the target data TGT_DATA is determined after the target data TGT_DATA is input into the memory 110.

Accordingly, the time required for completing the operation of the controller 120 to program the target data TGT_DATA into the memory 110 may be reduced compared to the embodiment described with reference to FIG. 6.

Figure 8:
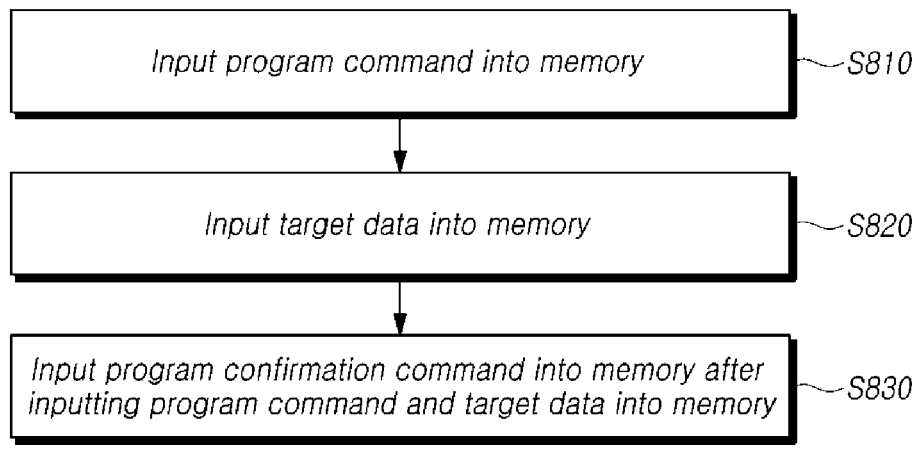
FIG. 8 illustrates a method of operating a storage device according to an embodiment of the present disclosure.

FIG. 8 illustrates a method of operating a storage device according to an embodiment of the present disclosure.

Referring to FIG. 8, an operating method of a storage device 100 may include inputting a program command PGM_CMD, requesting programming of target data TGT_DATA into all or some of a plurality of memory cells MC, to the memory 110, which includes a plurality of memory cells MC (S810).

The operating method of the storage device 100 may include inputting the target data TGT_DATA into the memory 110 (S820).

In addition, the operating method of the storage device 100 may include inputting, after inputting the program command PGM_CMD and the target data TGT_DATA into the memory 110, a program confirmation command PGM_CONF including information on cell types of memory cells to be programmed in target data TGT_DATA, from among a plurality of memory cells MC, and instructing the controller to start programming the target data TGT_DATA, previously input into the memory 110, to the memory cells (S830).

For example, in step S830, if a power-down event occurs after inputting the target data TGT_DATA into the memory 110, a cell type of the memory cells to be programmed with the target data TGT_DATA may be determined as a target type TGT_TYPE.

The power for the memory 110 may be supplied from an auxiliary power supply for supplying power to the storage device 100 when a power-down event occurs.

In this case, the target type TGT_TYPE may be an SLC type.

The operating method of the storage device 100 may further include inputting, after inputting the target data TGT_DATA to the memory 110, address information ADDR indicating locations of memory cells to be programmed with target data TGT_DATA, from among a plurality of memory cells MC, into the memory 110 together with a program confirmation command PGM_CONF.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
 a memory including a plurality of memory cells; and
 a controller configured to,
  input a program command requesting to program target data to all or a part of the plurality of memory cells into the memory,
  input the target data into the memory, and
  input, after inputting the program command and the target data into the memory, a program confirmation command including cell type information of memory cells to be programmed, from among the plurality of memory cells, with the target data and instructing an operation of programming the target data into the memory.

2. The storage device of claim 1, wherein the controller inputs, after inputting the target data into the memory, address information indicating locations of memory cells to be programmed with the target data into the memory together with the program confirmation command.

3. The storage device of claim 1, wherein, when a power-down event occurs after inputting the target data into the memory, the memory determines a cell type of memory cells to be programmed with the target data from among the plurality of memory cells as a target type.

4. The storage device of claim 3, further comprising an auxiliary power supply for supplying power to the storage device when a power-down event occurs,
 wherein the auxiliary power supply supplies power to the memory when a power-down event occurs after inputting the target data into the memory.

5. The storage device of claim 3, wherein the target type is a single level cell (SLC) type.

6. An operating method of a storage device comprising:
 inputting a program command requesting to program target data to all or a part of a plurality of memory cells into a memory including the plurality of memory cells;
 inputting the target data into the memory; and
 inputting, after inputting the program command and the target data into the memory, a program confirmation command including cell type information of memory cells to be programmed, from among the plurality of memory cells, with the target data and instructing start of an operation of programming the target data into the memory.

7. The operating method of claim 6, further comprising inputting, after inputting the target data into the memory, address information indicating locations of memory cells to be programmed with the target data into the memory together with the program confirmation command.

8. The operating method of claim 6, wherein the inputting a program confirmation command comprises, when a power-down event occurs after inputting the target data into the memory, determining a cell type of memory cells to be programmed with the target data, from among the plurality of memory cells, as a target type.

9. The operating method of claim 8, wherein power supplied to the memory is supplied from an auxiliary power supply for supplying power to the storage device when a power-down event occurs.

10. The operating method of claim 8, wherein the target type is a single level cell (SLC) type.

11. The storage device of claim 3, wherein the auxiliary power supply includes a capacitor that is charged when power is supplied from outside of the storage device.

12. The storage device of claim 11, wherein the capacitor is selected from a group consisting of a ceramic capacitor, a multilayer ceramic capacitor, a high dielectric constant capacitor, an electrolytic capacitor, and a tantalum polymer capacitor.

* * * * *